US012181554B2

United States Patent
Nezafat et al.

(10) Patent No.: US 12,181,554 B2
(45) Date of Patent: Dec. 31, 2024

(54) SYSTEM AND METHOD FOR QUANTITATIVE PARAMETER MAPPING USING MAGNETIC RESONANCE IMAGES

(71) Applicant: Beth Israel Deaconess Medical Center, Inc., Boston, MA (US)

(72) Inventors: Reza Nezafat, Newton, MA (US); Rui Guo, Jamaica Plain, MA (US)

(73) Assignee: BETH ISRAEL DEACONESS MEDICAL CENTER, INC., Boston, MA (US)

( * ) Notice: Subject to any disclaimer, the term of this patent is extended or adjusted under 35 U.S.C. 154(b) by 19 days.

(21) Appl. No.: 18/067,489

(22) Filed: Dec. 16, 2022

(65) Prior Publication Data

US 2023/0194641 A1    Jun. 22, 2023

Related U.S. Application Data

(60) Provisional application No. 63/291,822, filed on Dec. 20, 2021.

(51) Int. Cl.
*G01R 33/56*     (2006.01)
*G01R 33/50*     (2006.01)
(Continued)

(52) U.S. Cl.
CPC ......... *G01R 33/5608* (2013.01); *G01R 33/50* (2013.01); *G06N 3/0455* (2023.01); *G06N 3/08* (2013.01)

(58) Field of Classification Search
CPC .. G01R 33/50; G01R 33/5608; G06N 3/0455; G06N 3/08
See application file for complete search history.

(56) References Cited

U.S. PATENT DOCUMENTS

| 11,948,676 B2 * | 4/2024 | Xing ................. G01R 33/5608 |
| 2021/0223343 A1 * | 7/2021 | Koerzdoerfer ..... G01R 33/4828 |
| 2021/0239780 A1 * | 8/2021 | Fan ........................ G16H 30/40 |

OTHER PUBLICATIONS

Kellman P, Xue H, Chow K, Spottiswoode BS, Arai AE, Thompson RB. Optimized saturation recovery protocols for T1-mapping in the heart: influence of sampling strategies on precision. J Cardiovasc Magn Reson 2014; 16(55).

(Continued)

*Primary Examiner* — Gregory H Curran
(74) *Attorney, Agent, or Firm* — Quarles & Brady, LLP

(57) ABSTRACT

A system for quantitative parameter mapping using magnetic resonance (MR) image includes an input for receiving a plurality of weighted MR images of a subject and a corresponding at least one imaging parameter for the plurality of weighted MR images, and a quantitative parameter mapping neural network coupled to the input and configured to estimate at least one tissue parameter and generate at least one quantitative map for the at least one tissue parameter based on the plurality of weighted MR images of the subject and the corresponding at least one imaging parameter. The quantitative parameter mapping neural network can be trained using a set of training data utilizing at least one confounder for the quantification of the at least one tissue parameter. The system can further include a display coupled to the quantitative parameter mapping neural network to display the at least one quantitative map.

20 Claims, 6 Drawing Sheets

(51) Int. Cl.
 G06N 3/0455 (2023.01)
 G06N 3/08 (2023.01)

(56) References Cited

OTHER PUBLICATIONS

Kvernby S, Warntjes M, Engvall J, Carlhäll CJ, Ebbers T. Clinical feasibility of 3D-QALAS—Single breath-hold 3D myocardial T1- and T2-mapping. Magn. Reson. Imaging 2017;38:13-20.

Kvernby S, Warntjes MJ a. B, Haraldsson H, Carlhäll CJ, Engvall J, Ebbers T. Simultaneous three-dimensional myocardial T1 and T2 mapping in one breath hold with 3D-QALAS. J. Cardiovasc. Magn. Reson. 2014;16:102.

Leiner T, Rueckert D, Suinesiaputra A, Baessler B, Nezafat R, Isgum I, Young AA. Machine learning in cardiovascular magnetic resonance: basic concepts and applications. J Cardiovasc Magn Reson 2019;21(1):61.

Li Y, Wu J and Wu Q (2019) Classification of breast cancer histology images using multi-size and discriminative patches based on deep learning, IEEE Access 7 21400-8.

Liu X, Faes L, Kale A U, Wagner S K, Fu D J, Bruynseels A, Mahendiran T, Moraes G, Shamdas M and Kern C (2019) A comparison of deep learning performance against health-care professionals in detecting diseases from medical imaging: a systematic review and meta-analysis, The lancet digital health 1 e271-e97.

Mehta BB, Chen X, Bilchick KC, Salerno M, Epstein FH. Accelerated and navigator-gated look-locker imaging for cardiac T1 estimation (ANGIE): Development and application to T1 mapping of the right ventricle. Magn. Reson. Med. 2015;73:150-160.

Messroghli DR, Moon JC, Ferreira VM, Grosse-Wortmann L, He T, Kellman P, Mascherbauer J, Nezafat R, Salerno M, Schelbert EB, Taylor AJ, Thompson R, Ugander M, van Heeswijk RB, Friedrich MG. Clinical recommendations for cardiovascular magnetic resonance mapping of T1, T2, T2* and extracellular volume: A consensus statement by the Society for Cardiovascular Magnetic Resonance (SCMR) endorsed by the European Association for Cardiovascular Imaging (EACVI). J Cardiovasc Magn Reson 2017; 19(1):75.

Messroghli DR, Radjenovic A, Kozerke S, Higgins DM, Sivananthan MU, Ridgway JP. Modified Look-Locker inversion recovery (MOLLI) for high-resolution T1 mapping of the heart. Magn Reson Med 2004;52(1):141-146.

Mozes FE, Tunnicliffe EM, Pavlides M, Robson MD. Influence of fat on liver T1 measurements using modified Look-Locker inversion recovery (MOLLI) methods at 3T. J Magn Reson Imaging 2016;44(1):105-111.

Nezafat M, El-Rewaidy H, Kucukseymen S, Hauser TH, Fahmy AS. Deep convolution neural networks based artifact suppression in under-sampled radial acquisitions of myocardial T 1 mapping images. Phys Med Biol 2020;65 (22):225024.

Nordio G, Bustin A, Henningsson M, et al. 3D Sasha myocardial T1 mapping with high accuracy and improved precision. Magn. Reson. Mater. Physics, Biol. Med. 2019;32:281-289.

Nordio G, Bustin A, Odille F, et al. Faster 3D saturation-recovery based myocardial T1 mapping using a reduced number of saturation points and denoising. PLoS One 2020;15.

Nordio G, Henningsson M, Chiribiri A, Villa ADM, Schneider T, Botnar RM. 3D myocardial T1 mapping using saturation recovery. J. Magn. Reson. Imaging 2017;46:218-227.

Nordio G, Schneider T, Cruz G, et al. Whole-heart T1 mapping using a 2D fat image navigator for respiratory motion compensation. Magn. Reson. Med. 2020;83:178-187.

Pascanu, Razvan, Tomas Mikolov, and Yoshua Bengio. "On the difficulty of training recurrent neural networks." International conference on machine learning. Pmlr, 2013.

Piechnik SK, Ferreira VM, Dall'Armellina E, et al. Shortened Modified Look-Locker Inversion recovery (ShMOLLI) for clinical myocardial T1 mapping at 1.5 and 3 T within a 9 heartbeat breathhold. J. Cardiovasc. Magn. Reson. 2010;12:69.

Puntmann VO, Peker E, Chandrashekhar Y, Nagel E. T1 Mapping in Characterizing Myocardial Disease: A Comprehensive Review. Circ Res 2016; 119(2):277-299.

Qi H, Bustin A, Cruz G, et al. Free-running simultaneous myocardial T1/T2 mapping and cine imaging with 3D whole- heart coverage and isotropic spatial resolution. Magn. Reson. Imaging 2019;63:159-169.

Qi H, Jaubert O, Bustin A, et al. Free-running 3D whole heart myocardial T1 mapping with isotropic spatial resolution. Magn. Reson. Med. 2019;82:1331-1342.

Robson MD, Piechnik SK, Tunnicliffe EM, Neubauer S. T1 measurements in the human myocardium: the effects of magnetization transfer on the SASHA and MOLLI sequences. Magn Reson Med 2013;70(3):664-670.

Roes SD, Korosoglou G, Schar M, Westenberg JJ, van Osch MJ, de Roos A, Stuber M. Correction for heart rate variability during 3D whole heart MR coronary angiography. J Magn Reson Imaging 2008;27(5):1046-1053.

Ronneberger, Olaf, Philipp Fischer, and Thomas Brox. "U-net: Convolutional networks for biomedical image segmentation." Medical image computing and computer-assisted intervention-MICCAI 2015: 18th international conference, Munich, Germany, Oct. 5-9, 2015, proceedings, part III 18. Springer International Publishing, 2015.

Roujol S, Basha TA, Weingärtner S, et al. Impact of motion correction on reproducibility and spatial variability of quantitative myocardial T2 mapping. J. Cardiovasc. Magn. Reson. 2015;17:46.

Roujol S, Foppa M, Weingartner S, Manning WJ, Nezafat R. Adaptive registration of varying contrast-weighted images for improved tissue characterization (ARCTIC): application to T1 mapping. Magn Reson Med 2015;73(4):1469-1482.

Roujol S, Weingärtner S, Foppa M, et al. Accuracy, precision, and reproducibility of four T1 mapping sequences: A headto-head comparison of Molli, ShMolli, Sasha, and Sapphire. Radiology 2014;272:683-689.

Salerno M, Kramer CM. Advances in parametric mapping with CMR imaging. JACC Cardiovasc Imaging 2013;6 (7):806-822.

Santini F, Kawel-Boehm N, Greiser A, Bremerich J, Bieri O. Simultaneous T1 and T2 quantification of the myocardium using cardiac balanced-SSFP inversion recovery with interleaved sampling acquisition (CABIRIA). Magn Reson Med 2015;74(2):365-371.

Schelbert EB, Testa SM, Meier CG, Ceyrolles WJ, Levenson JE, Blair AJ, Kellman P, Jones BL, Ludwig DR, Schwartzman D, Shroff SG, Wong TC. Myocardial extravascular extracellular vol. fraction measurement by gadolinium cardiovascular magnetic resonance in humans: slow infusion versus bolus. J Cardiovasc Magn Reson 2011;13:16.

Shao J, Ghodrati V, Nguyen KL, Hu P. Fast and accurate calculation of myocardial T(1) and T(2) values using deep learning Bloch equation simulations (DeepBLESS). Magn Reson Med 2020;84(5):2831-2845.

Shao J, Liu D, Sung K, Nguyen KL, Hu P. Accuracy, precision, and reproducibility of myocardial T1 mapping: A comparison of four T1 estimation algorithms for modified looklocker inversion recovery (MOLLI). Magn. Reson. Med. 2017;78:1746-1756.

Shao J, Nguyen KL, Natsuaki Y, Spottiswoode B, Hu P. Instantaneous signal loss simulation (InSiL): an improved algorithm for myocardial T(1) mapping using the MOLLI sequence. J Magn Reson Imaging 2015;41(3):721-729.

Shao J, Rapacchi S, Nguyen KL, Hu P. Myocardial T1 mapping at 3.0 tesla using an inversion recovery spoiled gradient echo readout and bloch equation simulation with slice profile correction (Blesspc) T1 estimation algorithm. J Magn Reson Imaging 2016;43(2):414-425.

Simonyan, Karen, and Andrew Zisserman. "Very deep convolutional networks for large-scale image recognition." arXiv preprint arXiv:1409.1556 (2014).

Sussman MS, Wintersperger BJ. Modified look-locker inversion recovery (Molli) T1 mapping with inversion group (IG) fitting—A method for improved precision. Magn Reson Imaging 2019;62:38-45.

(56) References Cited

OTHER PUBLICATIONS

Sussman MS, Yang IY, Fok KH, Wintersperger BJ. Inversion group (IG) fitting: A new T1 mapping method for modified look-locker inversion recovery (MOLLI) that allows arbitrary inversion groupings and rest periods (including no rest period). Magn Reson Med 2016;75(6):2332-2340.
Taylor A J, Salerno M, Dharmakumar R and Jerosch-Herold M (2016) T1 mapping: basic techniques and clinical applications JACC: Cardiovascular Imaging 9 67-81.
Ugander M, Oki A J, Hsu L-Y, Kellman P, Greiser A, Aletras A H, Sibley C T, Chen M Y, Bandettini WP and Arai A E 2012 Extracellular volume imaging by magnetic resonance imaging provides insights into overt and sub-clinical myocardial pathology European heart journal 33 1268-78.
Weingärtner S, Akçakaya M, Basha T, et al. Combined saturation/inversion recovery sequences for improved evaluation of scar and diffuse fibrosis in patients with arrhythmia or heart rate variability. Magn. Reson. Med. 2014;71:1024-1034.
Weingartner S, Akcakaya M, Roujol S, Basha T, Stehning C, Kissinger KV, Goddu B, Berg S, Manning WJ, Nezafat R. Free-breathing post-contrast three-dimensional T1 mapping: Volumetric assessment of myocardial T1 values. Magn Reson Med 2015;73(1):214-222.
Weingartner S, Akcakaya M, Roujol S, Basha T, Tschabrunn C, Berg S, Anter E, Nezafat R. Free-breathing combined three-dimensional phase sensitive late gadolinium enhancement and T1 mapping for myocardial tissue characterization. Magn Reson Med 2015;74(4):1032-1041.
Weingartner S, Messner NM, Budjan J, Lossnitzer D, Mattler U, Papavassiliu T, Zollner FG, Schad LR. Myocardial T1- mapping at 3T using saturation-recovery: reference values, precision and comparison with Molli. J Cardiovasc Magn Reson 2016;18(84).
Weingartner S, Roujol S, Akcakaya M, Basha TA, Nezafat R. Free-breathing multislice native myocardial T1 mapping using the slice-interleaved T1 (Stone) sequence. Magn Reson Med 2014;74(1):115-124.
Xanthis CG, Bidhult S, Greiser A, et al. Simulation-based quantification of native T1 and T2 of the myocardium using a modified MOLLI scheme and the importance of Magnetization Transfer. Magn. Reson. Imaging 2018;48:96-106.
Xue H, Greiser A, Zuehlsdorff S, Jolly M-P, Guehring J, Arai AE, Kellman P. Phase-sensitive inversion recovery for myocardial T1 mapping with motion correction and parametric fitting. Magn Reson Med 2013;69(5):1408-1420.
Xue H, Shah S, Greiser A, Guetter C, Littmann A, Jolly MP, Arai AE, Zuehlsdorff S, Guehring J, Kellman P. Motion correction for myocardial T1 mapping using image registration with synthetic image estimation. Magn Reson Med 2012;67(6):1644-1655.
Zhang Q, Hann E, Werys K, et al. Deep learning with attention supervision for automated motion artefact detection in quality control of cardiac T1-mapping. Artif. Intell. Med. 2020;110.
Zhang Q, Su P, Chen Z, Liao Y, Chen S, Guo R, Qi H, Li X, Zhang X, Hu Z, Lu H, Chen H. Deep learning-based MR fingerprinting ASL ReconStruction (DeepMARS). Magn Reson Med 2020;84(2):1024-1034.
Zhu Y, Fahmy AS, Duan C, Nakamori S, Nezafat R. Automated myocardial T2 and extracellular vol. quantification in cardiac MRI using transfer learning-based myocardium segmentation. Radiology: Artificial Intelligence 2020;2(1):e190034.
Zhu Y, Kang J, Duan C, Nezafat M, Neisius U, Jang J, Nezafat R. Integrated motion correction and dictionary learning for free-breathing myocardial T1 mapping. Magn Reson Med 2019;81(4):2644-2654.
Aggarwal R, Sounderajah V, Martin G, Ting D S, Karthikesalingam A, King D, Ashrafian H and Darzi A (2021) Diagnostic accuracy of deep learning in medical imaging: a systematic review and meta-analysis NPJ digital medicine 4 1-23.
Akçakaya M, Basha TA, Weingärtner S, Roujol S, Berg S, Nezafat R. Improved quantitative myocardial T2 mapping: Impact of the fitting model. Magn. Reson. Med. 2015;74:93-105.
Akcakaya M, Weingartner S, Basha TA, Roujol S, Bellm S, Nezafat R. Joint myocardial T1 and T2 mapping using a combination of saturation recovery and T2 -preparation. Magn Reson Med 2016;76(3):888-896.
Akcakaya M, Weingartner S, Roujol S, Nezafat R. On the selection of sampling points for myocardial T1 mapping. Magn Reson Med 2015;73(5):1741-1753.
Bates D, Mächler M, Bolker BM, Walker SC. Fitting linear mixed-effects models using lme4. J. Stat. Softw. 2015;67:1-48.
Becker KM, Blaszczyk E, Funk S, et al. Fast myocardial T1 mapping using cardiac motion correction. Magn. Reson. Med. 2020;83:438-451.
Blume U, Lockie T, Stehning C, Sinclair S, Uribe S, Razavi R, Schaeffter T. Interleaved T1 and T2 relaxation time mapping for cardiac applications. Journal of Magnetic Resonance Imaging 2009;29(2):480-487.
Bush MA, Ahmad R, Jin N, Liu Y, Simonetti OP. Patient specific prospective respiratory motion correction for efficient, free-breathing cardiovascular MRI. Magn Reson Med 2019;81(6):3662-3674.
Bush MA, Pan Y, Jin N, et al. Prospective correction of patient-specific respiratory motion in myocardial T1 and T2 mapping. Magn. Reson. Med. 2021;85:855-867.
Captur G, et al., Journal of Cardiovascular Magnetic Resonance , A T1 and ECV phantom for global T1 mapping quality assurance: The T1 mapping and ECV standardisation in Cmr (T1MES) program, 2016, 18(Suppl 1):W14.
Captur G, Gatehouse P, Keenan KE, Heslinga F G, Bruehl R, Prothmann M, Graves M J, Eames R J, Torlasco C, Benedetti G, Donovan J, Ittermann B, Boubertakh R, Bathgate A, Royet C, Pang W, Nezafat R, Salerno M, Kellman P and Moon J C (2016b) A medical device-grade T1 and ECV phantom for global T1 mapping quality assurance-the T1 Mapping and ECV Standardization in cardiovascular magnetic resonance (T1MES) program Journal of cardiovascular magnetic resonance 18 58.
Captur G, Gatehouse P, Keenan KE, Heslinga FG, Bruehl R, Prothmann M, Graves MJ, Eames RJ, Torlasco C, Benedetti G, Donovan J, Ittermann B, Boubertakh R, Bathgate A, Royet C, Pang W, Nezafat R, Salerno M, Kellman P, Moon JC. A medical device-grade T1 and ECV phantom for global T1 mapping quality assurance-the T1 Mapping and ECV Standardization in cardiovascular magnetic resonance (T1MES) program. J Cardiovasc Magn Reson 2016; 18(1):58.
Captur G, Manisty C, Moon JC. Cardiac MRI evaluation of myocardial disease. Heart 2016; 102(18):1429-1435.
Chow K, Flewitt J, Pagano JJ, Green JD, Friedrich MG, Thompson RB. T2-dependent errors in Molli T1 values: simulations, phantoms, and in-vivo studies. J Cardiovasc Magn Reson 2012; 14(Suppl 1):P281.
Chow K, Flewitt JA, Green JD, Pagano JJ, Friedrich MG, Thompson RB. Saturation recovery single-shot acquisition (SASHA) for myocardial T(1) mapping. Magn Reson Med 2014;71(6):2082-2095.
Chow K, Yang Y, Shaw P, Kramer CM, Salerno M. Robust free-breathing Sasha T1 mapping with high-contrast image registration. J Cardiovasc Magn Reson 2016; 18(1):47.
Christodoulou AG, Shaw JL, Nguyen C, Yang Q, Xie Y, Wang N, Li D. Magnetic resonance multitasking for motion- resolved quantitative cardiovascular imaging. Nature Biomedical Engineering 2018;2(4):215-226.
Cohen O, Zhu B, Rosen Ms. Mr fingerprinting Deep Reconstruction NEtwork (DRONE). Magn Reson Med 2018;80(3):885-894.
D'Errico L, Sussman MS, Hanneman K, Wintersperger BJ. Precision-optimized single protocol pre-/post-contrast modified-look locker inversion T1 mapping using composite inversion group fitting. Magn. Reson. Imaging 2020;74:195-202.
Diakogiannis F I, Waldner F, Caccetta P and Wu C (2020) ResUNet-a: A deep learning framework for semantic segmentation of remotely sensed data ISPRS Journal of photogrammetry and remote sensing 162 94-114.
Doneva M, Börnert P, Eggers H, Stehning C, Senegas J, Mertins A. Compressed sensing reconstruction for magnetic resonance parameter mapping. Magn Reson Med 2010;64(4):1114-1120.

(56) References Cited

OTHER PUBLICATIONS

El-Rewaidy H, Guo R, Paskavitz A, Yankama T, Ngo L, Menze B and Nezafat R (2021) MyoMapNet: Accelerated Modified Look-Locker Inversion Recovery Myocardial T1 Mapping via Neural Networks arXiv preprint arXiv:2104.00143.

El-Rewaidy H, Nezafat M, Jang J, Nakamori S, Fahmy AS, Nezafat R. Nonrigid active shape model-based registration framework for motion correction of cardiac T1 mapping. Magn Reson Med 2018;80(2):780-791.

Fahmy A S, El-Rewaidy H, Nezafat M, Nakamori S and Nezafat R (2019) Automated analysis of cardiovascular magnetic resonance myocardial native T1 mapping images using fully convolutional neural networks Journal of cardiovascular magnetic resonance 21 7.

Fahmy A S, Neisius U, Chan R H, Rowin E J, Manning W J, Maron M S and Nezafat R (2020) Three-dimensional deep convolutional neural networks for automated myocardial scar quantification in hypertrophic cardiomyopathy: a multicenter multivendor study Radiology 294 52-60.

Fitts M, Breton E, Kholmovski EG, et al. Arrhythmia insensitive rapid cardiac T1 mapping pulse sequence. Magn. Reson. Med. 2013;70:1274-1282.

Gai ND, Stehning C, Nacif M, Bluemke DA. Modified Look-Locker T1 evaluation using Bloch simulations: human and phantom validation. Magn Reson Med 2013;69(2):329-336.

Gatsoni O, Aletras AH, Heiberg E, Berggran K. T1 Mapping By Means Of Deep Learning Neural Networks Using Both Saturation Recovery and Inversion Recovery Data. In: Society for Cardiovascular Magnetic Resonance (SCMR). Orlando, FL; 2020.

Guo et al., "Accelerated cardiac T1 mapping in four heartbeats within inline MyoMapNet: a deep learning-based T1 estimation approach," Journal of Cardiovascular Magnetic Resonance (2022) 24:6.

Guo R, Cai X, Kucukseymen S, et al. Free-breathing simultaneous myocardial T1 and T2 mapping with whole left ventricle coverage. Magn. Reson. Med. 2020;85.

Guo R, Cai X, Kucukseymen S, et al. Free-breathing whole-heart multi-slice myocardial T1 mapping in 2 minutes. Magn. Reson. Med. 2021;85:89-102.

Guo R, Chen Z, Herzka DA, Luo J, Ding H. A three-dimensional free-breathing sequence for simultaneous myocardial T1 and T2 mapping. Magn. Reson. Med. 2019;81:1031-1043.

Guo R, Chen Z, Wang Y, Herzka DA, Luo J, Ding H. Three-dimensional free breathing whole heart cardiovascular magnetic resonance T1 mapping at 3 T. J Cardiovasc Magn Reson 2018;20(1):64.

Haaf P, Garg P, Messroghli D R, Broadbent D A, Greenwood J P and Plein S (2017) Cardiac T1 mapping and extracellular volume (ECV) in clinical practice: a comprehensive review Journal of cardiovascular magnetic resonance 18 1-12.

Hamilton JI, Currey D, Rajagopalan S, Seiberlich N. Deep learning reconstruction for cardiac magnetic resonance fingerprinting T1 and T2 mapping. Magn Reson Med 2021;85(4):2127-2135.

Hamilton JI, Jiang Y, Chen Y, et al. MR fingerprinting for rapid quantification of myocardial T1, T2, and proton spin density. Magn. Reson. Med. 2017;77:1446-1458.

Hann E, Popescu I A, Zhang Q, Gonzales R A, Barutcu A, Neubauer S, Ferreira V M and Piechnik S K (2021) Deep neural network ensemble for on-the-fly quality control-driven segmentation of cardiac MRI T1 mapping Medical image analysis 71 102029.

He K, Zhang X, Ren S and Sun J InProceedings of the IEEE conference on computer vision and pattern recognition, (2016a), vol. Series): InProceedings of the IEEE conference on computer vision and pattern recognition) pp. 770-778.

Higgins DM, Ridgway JP, Radjenovic A, Sivananthan UM, Smith MA. T1 measurement using a short acquisition period for quantitative cardiac applications. Medical physics 2005;32(6):1738-1746.

Hirra I, Ahmad M, Hussain A, Ashraf M U, Saeed I A, Qadri S F, Alghamdi A M and Alfakeeh A S (2021) Breast Cancer Classification From Histopathological Images Using Patch-Based Deep Learning Modeling IEEE Access 9 24273-87.

Inati SJ, Naegele JD, Zwart NR, Roopchansingh V, Lizak MJ, Hansen DC, Liu CY, Atkinson D, Kellman P, Kozerke S, Xue H, Campbell-Washburn AE, Sørensen TS, Hansen Ms. ISMRM Raw data format: A proposed standard for MRI raw datasets. Magn Reson Med 2017;77(1):411-421.

Jaubert O, Cruz G, Bustin A, et al. Free-running cardiac magnetic resonance fingerprinting: Joint T1/T2 map and Cine imaging. Magn. Reson. Imaging 2020;68:173-182.

Jun Y, Shin H, Eo T, Kim T and Hwang D (2021) Deep model-based magnetic resonance parameter mapping network (Dopamine) for fast T1 mapping using variable flip angle method Medical image analysis 70 102017.

Kellman P and Hansen M S (2014) T1-mapping in the heart: accuracy and precision Journal of cardiovascular magnetic resonance 16 1-20.

Kellman P, Arai AE, Xue H. T1 and extracellular vol. mapping in the heart: Estimation of error maps and the influence of noise on precision. J. Cardiovasc. Magn. Reson. 2013;15:56.

Kellman P, Herzka DA, Arai AE, Hansen MS. Influence of Off-resonance in myocardial T1-mapping using SSFP based MOLLI method. J Cardiovasc Magn Reson 2013;15(1):63.

Kellman P, Herzka DA, Hansen MS. Adiabatic Inversion Pulses for Myocardial T1 Mapping. Magn Reson Med 2014;71(4):1428-1434.

Kellman P, Wilson JR, Xue H, Ugander M, Arai AE. Extracellular vol. fraction mapping in the myocardium, part 1: evaluation of an automated method. J Cardiovasc Magn Reson 2012;14(63).

* cited by examiner

SYSTEM AND METHOD FOR QUANTITATIVE PARAMETER MAPPING USING MAGNETIC RESONANCE IMAGES

CROSS-REFERENCE TO RELATED APPLICATIONS

This application is based on, claims priority to, and incorporates herein by reference in its entirety U.S. Ser. No. 63/291,822 filed Dec. 20, 2021, and entitled "System and Method for Accelerated Magnetic Resonance Tissue Relaxometry."

STATEMENT REGARDING FEDERALLY SPONSORED RESEARCH

This invention was made with government support under grant HL129157 awarded by the National Institutes of Health. The government has certain rights in the invention.

FIELD

The present disclosure relates generally to magnetic resonance imaging and, more particularly, to systems and methods for quantitative MRI such as, for example, tissue relaxometry.

BACKGROUND

Quantitative magnetic resonance imaging (MRI) typically uses acquisition of multi-contrast images followed by signal fitting to generate quantitative parameter maps. This technique requires longer acquisition time than qualitative MRI and computationally expensive algorithms for signal fitting. Quantitative MRI can be accelerated by acquiring an undersampled set of MRI k-space data, but data undersampling leads to artifacts that obscure image features and impact quantification accuracy. Although constrained reconstruction methods (e.g., compressed sensing) can reduce the undersampling artifacts, they require iterative algorithms which are time consuming.

One example of an application for quantitative MRI is cardiac magnetic resonance (MR). Cardiac MR is a powerful imaging modality in the evaluation of patients with cardiovascular disease. Over the past two decades, there has been significant growth in both research and clinical applications of cardiac MR. In addition to cardiac function and structure measures, cardiac MR provides deep phenotyping of myocardial tissue composition to assess myocardial fibrosis, edema, perfusion, and microstructure. Cardiac MR can noninvasively assess heart and vascular abnormalities, including biventricular structure/function, blood hemodynamics, myocardial tissue composition, microstructure, perfusion, metabolism, coronary microvascular function, and aortic distensibility/stiffness. One of the main advantages of cardiac MR over other cardiac imaging modalities is its ability to noninvasively characterize myocardial tissue composition.

Cardiac MR can be used to evaluate myocardial viability and can also be used to assess the presence of diffuse interstitial fibrosis via $T_1$ and extracellular volume mappings, edema via $T_2$ mappings, and iron via $T_2^*$ mappings. Numerous techniques have been proposed to perform $T_1$ mapping of the heart. Most of these techniques are based on a $T_1$ sensitizing preparation, such as an inversion or saturation pulse combined with a snap-shot imaging readout, each with a distinct profile of advantages and disadvantages. Modified Look-Locker Imaging (MOLLI) is currently the only commercially available cardiac $T_1$ mapping sequence. Myocardial $T_1$ mapping with MOLLI is collected during a single breath-hold per slice with coverage over one to three slices. The analysis involves the manual drawing of the region of interest to delineate the myocardial signal for calculating global and regional $T_1$ values. Saturation recovery-based $T_1$ mapping sequences (e.g., SASHA and SAPPHIRE) are alternatives to inversion recovery-based sequences with improved accuracy, albeit reduced precision compared to MOLLI.

$T_2^*$ mapping is commonly achieved using multigradient echo readouts with variable echo times. Most modern techniques use dark blood contrast, acquired in the late diastole phase, where a double inversion recovery pulse is employed to null the blood signal and alleviate partial voluming effects. A free-breathing alternative for $T_2^*$ mapping was proposed, using single-shot imaging with multiple repetitions and motion correction in postprocessing. $T_2$ mapping is commonly based on $T_2$ magnetization preparation modules combined with single-shot image readouts. Rest periods are inserted between different acquisitions, allowing for signal recovery. Alternatively, saturation preparation avoids rest periods at the cost of reduced signal to noise ratio (SNR). A two- or three-parameter fit model can be used for estimating $T_2$ values from $T_2$-weighted images. Alternative sequence designs based on gradient- and spin-echo readout have also been proposed, potentially allowing gains in acquisition efficiency. Finally, several free-breathing $T_2$ sequences emerged for multislice 2D/3D acquisitions with higher spatial coverage and spatial resolution.

There have been recent advances in multiparametric mapping to simultaneously measure different tissue contrasts to reduce overall scan time and simplify the examination. For example, joint $T_1$ and $T_2$ mapping has been proposed, by combining $T_1$ sensitizing elements, such as inversion recovery (IR) or saturation recovery (SR) pulses, with a $T_2$ preparation. Cardiac MR fingerprinting (MRF) enables joint parameter mapping by unconventionally sampling with a very high temporal resolution and highly undersampled spiral readout. A combination of preparation modules may be used to sensitize the magnetization in cardiac MRF. Voxel-wise maps may then obtained by matching the signal evolution to precalculated dictionaries instead of conventional curve fitting. Multitasking is a new framework for multiparameter imaging of dynamic processes, in which signal dimensions such as $T_1$ and $T_2$ contrast or physiological motion are partially sampled and low-rank tensor reconstructions are used to compensate for missing information. Despite the potential of MRF and multitasking as promising free-running tissue characterization sequences, there are still numerous challenges, including lengthy reconstruction time, sensitivity to field inhomogeneity, and other imaging confounders.

In addition to classical relaxometry parameters like $T_1$, $T_2$, $T_2^*$, other cardiac MRI markers for myocardial tissue characterization are emerging. Longitudinal relaxation in the rotating frame ($T_{1\rho}$) probes the molecular environment at intermediate frequencies below the Larmor frequency and is promising for detection of myocardial fibrosis. MT, a well-established contrast mechanism for visualizing signals from bound pool protons in macromolecules, has been used for the assessment of myocardial fibrosis. Chemical exchange saturation transfer, based on proton exchange between free water and solute protons in metabolites like creatine, can also assess the metabolic activity and aid detection of infarcted tissue. The sensitivity of these sequence to field inhomogeneity and cardiac motion remain major challenges.

It would be desirable to provide a system and method for rapid quantitative MR including, for example, myocardial $T_1$ mapping or other tissue relaxometry, with accuracy and precision that can also reduce the overall scan time.

SUMMARY

In accordance with an embodiment, a system for quantitative parameter mapping using magnetic resonance (MR) images includes an input for receiving a plurality of weighted MR images of a subject and a corresponding at least one imaging parameter for the plurality of weighted MR images, a quantitative parameter mapping neural network coupled to the input and configured to estimate at least one tissue parameter and generate at least one quantitative map for the at least one tissue parameter based on the plurality of weighted MR images of the subject and the corresponding at least one imaging parameter for the plurality of weighted MR images, and a display coupled to the quantitative parameter mapping neural network and configured to display the at least one quantitative map. The quantitative parameter mapping neural network can be trained using a set of training data utilizing at least one confounder for the quantification of the at least one tissue parameter.

In accordance with another embodiment, a method for quantitative parameter mapping using magnetic resonance (MR) images includes acquiring, using an magnetic resonance imaging (MRI) system, MR data from a subject for a plurality of weighted images using a pulse sequence, generating a plurality of weighted MR images of a subject from the acquired MR data, each of the plurality of weighted MR images having a corresponding at least one imaging parameter, and providing, using a processor, the plurality of weighted MR images of the subject and the corresponding at least one imaging parameter for the plurality of weighted MR images to a quantitative parameter mapping neural network. The quantitative parameter mapping neural network can be trained using a set of training data utilizing at least one confounder for the quantification of the at least one tissue parameter. The method further incudes generating, using the quantitative parameter mapping neural network, an estimate of a at least one tissue parameter and at least one quantitative map for the at least one tissue parameter based on the plurality of weighted MR images of the subject and the corresponding at least one imaging parameter for the plurality of weighted MR images, and displaying, using a display, the at least one quantitative map.

In accordance with another embodiment, a magnetic resonance imaging (MRI) system includes a magnet system configured to generate a polarizing magnetic field about at least a portion of a subject, a magnetic gradient system including a plurality of magnetic gradient coils configured to apply at least one magnetic gradient field to the polarizing magnetic field, a radio frequency (RF) system configured to apply an RF field to the subject and to receive magnetic resonance signals from the subject using a coil array, and a computer system. The computer system can be programmed to acquire MR data from a subject for a plurality of weighted images using a pulse sequence, generate a plurality of weighted MR images of a subject from the acquired MR data, each of the plurality of weighted MR images having a corresponding at least one imaging parameter, and provide the plurality of weighted MR images of the subject and the corresponding at least one imaging parameter for the plurality of weighted MR images to a quantitative parameter mapping neural network. The quantitative parameter mapping neural network can be trained using a set of training data utilizing at least one confounder for the quantification of the at least one tissue parameter. The computer system can be further programmed to generate, using the quantitative parameter mapping neural network, an estimate of at least one tissue parameter and at least one quantitative map for the at least one tissue parameter based on the plurality of weighted MR images of the subject and the corresponding at least one imaging parameter for the plurality of weighted MR images.

BRIEF DESCRIPTION OF THE DRAWINGS

The present disclosure will hereafter be described with reference to the accompanying drawings, wherein like reference numerals denote like elements.

DETAILED DESCRIPTION

Figure 1:
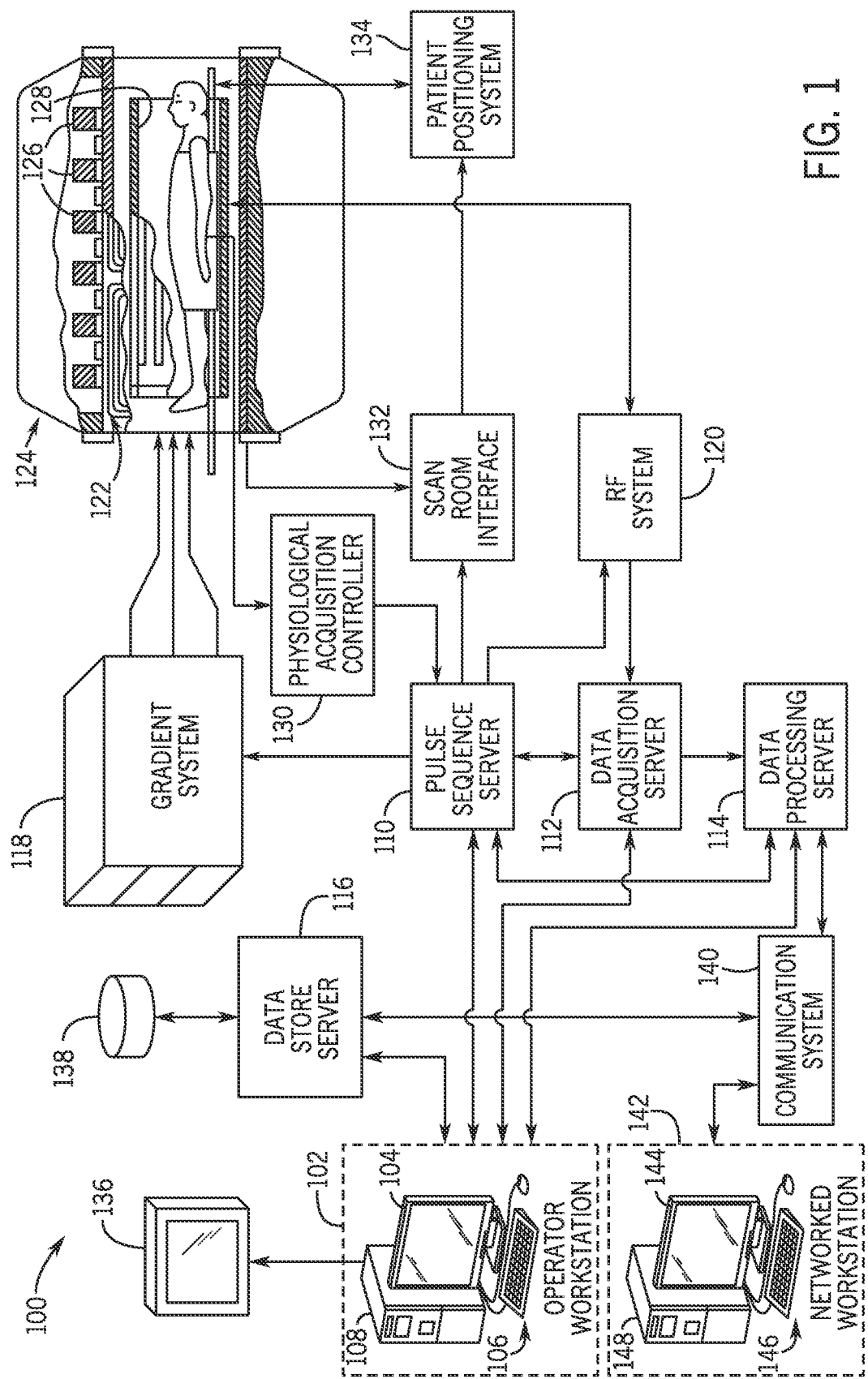
FIG. 1 is a block diagram of an example MRI system in accordance with an embodiment.

Referring now to FIG. 1, the disclosed systems and methods may be implemented using or designed to accompany a magnetic resonance imaging ("MRI") system 100, such as is illustrated in FIG. 1. The MRI system 100 includes an operator workstation 102, which will typically include a display 104, one or more input devices 106 (such as a keyboard and mouse or the like), and a processor 108. The processor 108 may include a commercially available programmable machine running a commercially available operating system. The operator workstation 102 provides the operator interface that enables scan prescriptions to be entered into the MRI system 100. In general, the operator workstation 102 may be coupled to multiple servers, including a pulse sequence server 110; a data acquisition server 112; a data processing server 114; and a data store server 116. The operator workstation 102 and each server 110, 112, 114, and 116 are connected to communicate with each other. For example, the servers 110, 112, 114, and 116 may be connected via a communication system 140, which may include any suitable network connection, whether wired, wireless, or a combination of both. As an example, the communication system 140 may include both proprietary and/or dedicated networks, as well as open networks, such as the internet.

The pulse sequence server 110 functions in response to instructions downloaded from the operator workstation 102 to operate a gradient system 118 and a radiofrequency ("RF") system 120. Gradient waveforms to perform the prescribed scan are produced and applied to the gradient system 118, which excites gradient coils in an assembly 122 to produce the magnetic field gradients $G_x$, $G_y$, $G_z$ used for position encoding magnetic resonance signals. The gradient coil assembly 122 forms part of a magnet assembly 124 that includes a polarizing magnet 126 and a whole-body RF coil 128.

RF waveforms are applied by the RF system 120 to the RF coil 128, or a separate local coil (not shown in FIG. 1), in order to perform the prescribed magnetic resonance pulse sequence. Responsive magnetic resonance signals detected by the RF coil 128, or a separate local coil, are received by the RF system 120, where they are amplified, demodulated, filtered, and digitized under direction of commands produced by the pulse sequence server 110. The RF system 120 includes an RF transmitter for producing a wide variety of RF pulses used in MRI pulse sequences. The RF transmitter is responsive to the scan prescription and direction from the pulse sequence server 110 to produce RF pulses of the desired frequency, phase, and pulse amplitude waveform. The generated RF pulses may be applied to the whole-body RF coil 128 or to one or more local coils or coil arrays.

The RF system 120 also includes one or more RF receiver channels. Each RF receiver channel includes an RF preamplifier that amplifies the magnetic resonance signal received by the coil 128 to which it is connected, and a detector that detects and digitizes the I and Q quadrature components of the received magnetic resonance signal. The magnitude of the received magnetic resonance signal may, therefore, be determined at any sampled point by the square root of the sum of the squares of the I and Q components:

$$M=\sqrt{I^2+Q^2} \quad \text{Eqn. 1;}$$

and the phase of the received magnetic resonance signal may also be determined according to the following relationship:

$$\varphi=\tan^{-1}(Q/I) \quad \text{Eqn. 2.}$$

The pulse sequence server 110 also optionally receives patient data from a physiological acquisition controller 130. By way of example, the physiological acquisition controller 130 may receive signals from a number of different sensors connected to the patient, such as electrocardiogram ("ECG") signals from electrodes, or respiratory signals from a respiratory bellows or other respiratory monitoring device. Such signals are typically used by the pulse sequence server 110 to synchronize, or "gate," the performance of the scan with the subject's heart beat or respiration.

The pulse sequence server 110 also connects to a scan room interface circuit 132 that receives signals from various sensors associated with the condition of the patient and the magnet system. It is also through the scan room interface circuit 132 that a patient positioning system 134 receives commands to move the patient to desired positions during the scan.

The digitized magnetic resonance signal samples produced by the RF system 120 are received by the data acquisition server 112. The data acquisition server 112 operates in response to instructions downloaded from the operator workstation 102 to receive the real-time magnetic resonance data and provide buffer storage, such that no data is lost by data overrun. In some scans, the data acquisition server 112 does little more than pass the acquired magnetic resonance data to the data processor server 114. However, in scans that require information derived from acquired magnetic resonance data to control the further performance of the scan, the data acquisition server 112 is programmed to produce such information and convey it to the pulse sequence server 110. For example, during prescans, magnetic resonance data is acquired and used to calibrate the pulse sequence performed by the pulse sequence server 110. As another example, navigator signals may be acquired and used to adjust the operating parameters of the RF system 120 or the gradient system 118, or to control the view order in which k-space is sampled. In still another example, the data acquisition server 112 may also be employed to process magnetic resonance signals used to detect the arrival of a contrast agent in a magnetic resonance angiography ("MRA") scan. By way of example, the data acquisition server 112 acquires magnetic resonance data and processes it in real-time to produce information that is used to control the scan.

The data processing server 114 receives magnetic resonance data from the data acquisition server 112 and processes it in accordance with instructions downloaded from the operator workstation 102. Such processing may, for example, include one or more of the following: reconstructing two-dimensional or three-dimensional images by performing a Fourier transformation of raw k-space data; performing other image reconstruction techniques, such as iterative or back-projection reconstruction techniques; applying filters to raw k-space data or to reconstructed images; generating functional magnetic resonance images; calculating motion or flow images; and so on.

Images reconstructed by the data processing server 114 are conveyed back to the operator workstation 102. Images may be output to operator display 112 or a display 136 that is located near the magnet assembly 124 for use by attending clinician. Batch mode images or selected real time images are stored in a host database on disc storage 138. When such images have been reconstructed and transferred to storage, the data processing server 114 notifies the data store server 116 on the operator workstation 102. The operator workstation 102 may be used by an operator to archive the images, produce films, or send the images via a network to other facilities.

The MRI system 100 may also include one or more networked workstations 142. By way of example, a networked workstation 142 may include a display 144, one or more input devices 146 (such as a keyboard and mouse or the like), and a processor 148. The networked workstation 142 may be located within the same facility as the operator workstation 102, or in a different facility, such as a different healthcare institution or clinic. The networked workstation 142 may include a mobile device, including phones or tablets.

The networked workstation 142, whether within the same facility or in a different facility as the operator workstation 102, may gain remote access to the data processing server 114 or data store server 116 via the communication system 140. Accordingly, multiple networked workstations 142 may have access to the data processing server 114 and the data store server 116. In this manner, magnetic resonance data, reconstructed images, or other data may exchange between the data processing server 114 or the data store server 116 and the networked workstations 142, such that the data or images may be remotely processed by a networked workstation 142. This data may be exchanged in any suitable format, such as in accordance with the transmission control protocol ("TCP"), the internet protocol ("IP"), or other known or suitable protocols.

The present disclosure describes a system and method that uses machine learning or artificial intelligence (e.g., a neural network) to enable rapid measurement of MRI tissue parameters (e.g., $T_1$, $T_2$, $T_2^*$, $T_1p$, etc.) and significantly reduces overall scan time for quantitative MRI. In some embodiments, the system and method for quantitative parameter mapping can include a quantitative parameter mapping (or contrast-decoding) neural network configured to estimate quantitative tissue parameters (e.g., $T_1$, $T_2$, $T_2^*$, $T_1p$, etc.) and to generate quantitative parameter maps (or quantitative maps). In some embodiments, the quantitative parameter mapping neural network can be a fully connected (FC) neural network. In some embodiments, the quantitative parameter mapping neural network can be an encoder-decoder neural network with skip connections (e.g., U-Net). The quantitative parameter mapping neural network can be trained using existing acquired MR data or a combination of numerically simulated MR data and MR phantom data. In some embodiments, the training data (e.g., existing acquired MR data or a combination of numerically simulated MR data and MR phantom data) can encompass multiple different confounders (e.g., angle, heart rate, $B_0$, $B_1$, off-resonance, etc. In some embodiments, the input for the quantitative parameter mapping neural network can be a plurality of weighted MR images of a subject and at least one imaging parameter of each of the plurality of weighted MR images. In some embodiments, the plurality of weighted images can be multi-contrast (e.g., a combination of weighting for a plurality of tissue parameters) images. In some embodiments, the plurality of weighted images include weighting for a single tissue parameter. The imaging parameter can include, for example, inversion recovery time (TI), flip angle, echo time (TE), repetition time (TR), etc. In some embodiments, the generated quantitative parameter maps can be automatically analyzed using a post-processing module that includes machine learning (e.g., a neural network). In some embodiments the quantitative parameter mapping neural network can be used in an inline implementation on an MRI system (e.g., MRI system 100 shown in FIG. 1) for acquisition and inline reconstruction of quantitative parameter maps on the MRI system. Accordingly, the system and method for quantitative parameter mapping using the quantitative parameter mapping neural network can be integrated into the clinical workflow acquisition and reconstruction of quantitative parameter mapping.

In some embodiments, the system and method for quantitative parameter mapping can be configured for cardiac MR applications. While the example of the cardiac MR application is discussed herein, it should be understood that the disclosed systems and methods for quantitative parameter mapping may be used for other MR applications. In some embodiments, the system and method for quantitative parameter mapping may be configured for rapid myocardial $T_1$ mapping and can utilize a quantitative parameter mapping neural network implemented as a fully connected (FC) neural network (or other deep learning model) to estimate pixel-wise $T_1$ from three or more weighted images of a subject, for example, four $T_1$-weighted images collected after a single inversion pulse in four heartbeats. For example, a single Look-Locker sequence (or experiment) can be performed to collect four $T_1$-weighted images, which can be subsequently used in the $T_1$ mapping FC neural network to rapidly estimate $T_1$. In some embodiments, the $T_1$ mapping FC neural network can be configured to use pixel-wise $T_1$-weighted signals and corresponding inversion times to estimate $T_1$ values from a reduced number of $T_1$-weighted images. In some embodiments, the $T_1$ mapping FC neural network can be trained using existing native $T_1$ data, existing post-contrast $T_1$ data, or a combination of both existing native and existing post-contrast $T_1$ data. In some embodiments, the $T_1$ mapping FC neural network can be trained using existing data acquired with Modified Look-Locker Inversion Recovery (MOLLI) sequences. As mentioned, in some embodiments, the number of T1-weighted images of a subject input to a trained $T_1$ mapping FC neural network to generate one or more T1 map(s) for the subject can be four. Accordingly, the $T_1$ mapping FC neural network (e.g., trained using MOLLI data), can be configured to estimate $T_1$ values from only four $T_1$-weighted images and to enable myocardial $T_1$ mapping in four heartbeats. In some embodiments, the number of T1-weighted images of a subject input to a trained $T_1$ mapping FC neural network to generate one or more T1 map(s) for the subject can be three or more. In some embodiments, the $T_1$ mapping FC neural network can be used in an inline implementation on an MRI system (e.g., MRI system 100 shown in FIG. 1) for acquisition and inline reconstruction of $T_1$ maps on the MRI system. Accordingly, the system and method for $T_1$ mapping using the $T_1$ mapping FC neural network can be integrated into the clinical workflow acquisition and reconstruction of $T_1$ mapping.

Figure 2:
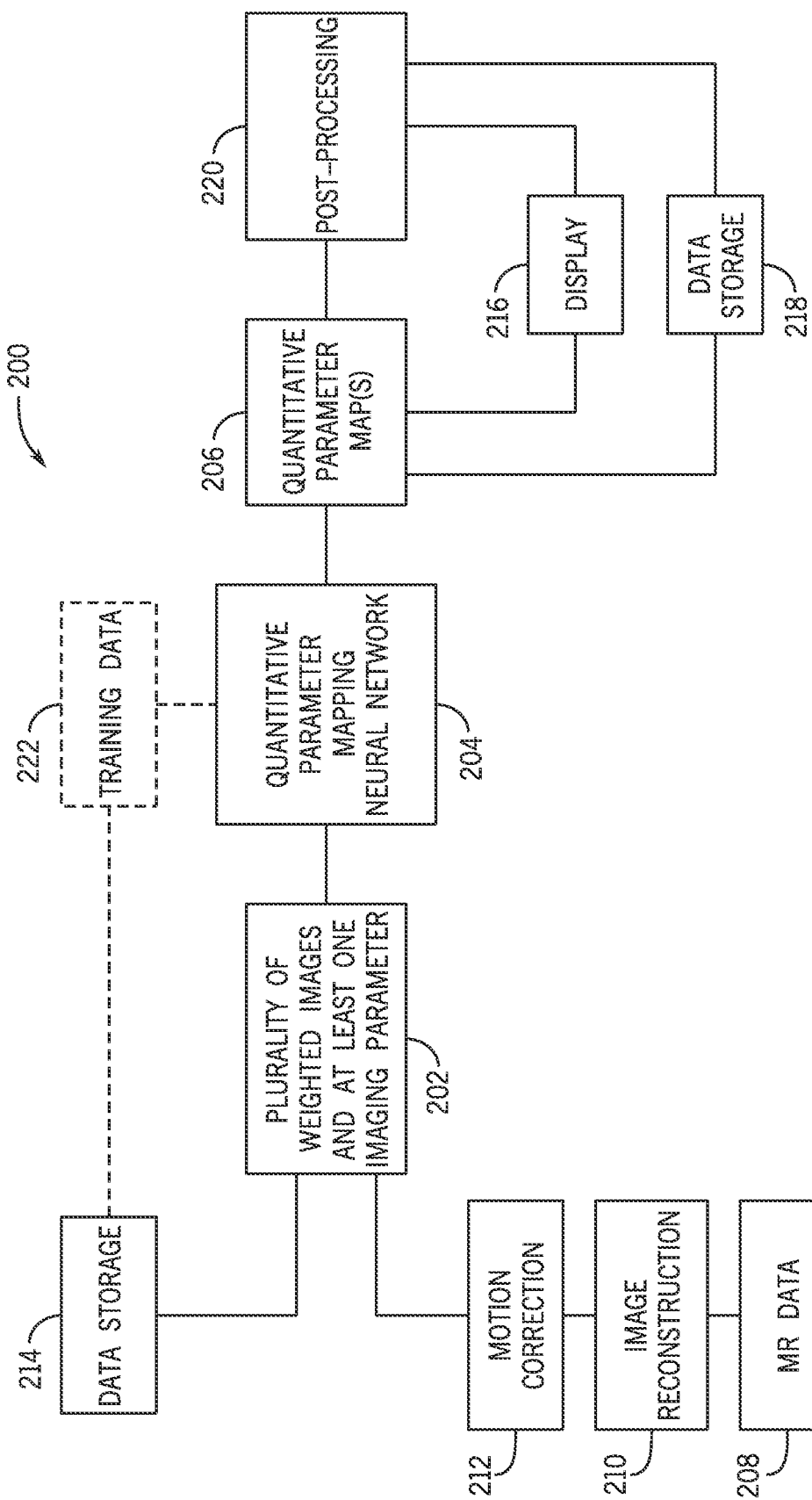
FIG. 2 is a block diagram of a system for quantitative parameter mapping using magnetic resonance images in accordance with an embodiment.

FIG. 2 is a block diagram of a system for quantitative parameter mapping using magnetic resonance images in accordance with an embodiment. The system 200 for quantitative parameter mapping can include an input 202 including a plurality of weighted images of a subject and at least one imaging parameter corresponding to the plurality of weighted images, a quantitative parameter mapping (or contrast decoding) neural network 204, an output 206 including, for example, one or more quantitative parameter maps, a post-processing module 220, data storage 214, 218, and display 218. The at least one imaging parameter can include, for example, inversion recovery time (TI), flip angle, echo time (TE), repetition time (TR), etc. In some embodiments, the plurality of weighted images ae weighted based on one or more tissue properties or parameters and can be, for example, $T_1$-weighted images, $T_2$-weighted images, $T_2^*$-weighted images, $T_{1p}$-weighted images, or multi-contrast images with weighting for two or more tissue parameters. In some embodiments, where the images are $T_1$-weighted images, four $T_1$-weighted images and four corresponding inversion times (TI) for the four $T_1$-weighted images can be input to the quantitative parameter mapping neural network 204. In some embodiments, the plurality of weighted images are cardiac MR images. As mentioned, in some embodiments, the plurality of weighted images may be multi-contrast images. An example multi-contrast pulse sequence which may be used to acquire the retrieved or real-time plurality of weighted images is describes further below with respect to FIG. 4. In some embodiments, the plurality of weighted images may be $T_1$-weighted images. An example $T_1$-weighted pulse sequence which may be used to acquire the plurality of weighted images is discussed further below with respect to FIG. 5. In some embodiments, the plurality of weighted images may be $T_2$-weighted images and a pulse sequence for acquiring $T_2$-weighted MR data may be used to acquire plurality of weighted images. In some embodiments, the $T_2$ pulse sequence can include, for example, a series of $T_2$-preparation modules and data acquisition modules with varying times of $T_2$ preparation.

In some embodiments, the input 202 plurality of weighted images of a subject and the at least one imaging parameter may be retrieved from data storage (or memory) 214 of system 200, data storage of an imaging system (e.g., disc storage 138 of MRI system 100 shown in FIG. 1), or data storage of other computer systems. In some embodiments, the plurality of weighted images of a subject may be acquired in real time from a subject using an MRI system (e.g., MRI system 100 show in FIG. 1). For example, MR data 208 can be acquired from a subject using a pulse sequence performed on the MRI system and configured to acquire weighted or multi-contrast MR data, where the real time acquisition has at least one imaging parameter which may also be included in input 202. The acquired MR data 208 may be stored in, for example, data storage 214 of system 200, data storage of an MR system (e.g., MRI system 100 shown in FIG. 1), or data storage of other computer systems. The acquired MR data 208 may then be reconstructed into a plurality of weighted images (e.g., multi-contrast weighted images, $T_1$-weighted images, $T_2$-weighted images, $T_2^*$-weighted images, etc.) 202 using known reconstruction methods. For example, image reconstruction 210 may be used to generate a plurality of multi-contrast weighted images using the pule sequence shown in FIG. 4. In another example, image reconstruction 210 may be used to generate four $T_1$-weighted images ($S_1$, $S_2$, $S_3$, $S_4$) acquired using the LL4 sequence shown in FIG. 5. In some embodiments, motion correction 212 may also be performed on the plurality of weighted images 202 using known methods, including, for example machine learning.

The plurality of weighted images of a subject and the corresponding at least one imaging parameter 202 may be provided as an input into the quantitative parameter mapping neural network 204. In some embodiments, the quantitative parameter mapping neural network 204 may be configured to estimate one or more quantitative tissue parameters (e.g., $T_1$, $T_2$, $T_2^*$, $T_1p$, etc.). The quantitative parameter mapping neural network 204 may also be configured to generate one or more quantitative parameter maps 206 for the subject (e.g., $T_1$ map(s), $T_2$ maps, and/or $T_2^*$ maps, etc). For example, for $T_1$-mapping, the quantitative parameter mapping neural network 204 can be configured to estimate pixel-wise $T_1$ values using an input of a plurality of $T_1$-weighted images of a subject and corresponding inversion times as the imaging parameter. In some embodiments, the quantitative parameter mapping neural network 204 may be implemented using known machine learning or artificial intelligence models or architectures. In some embodiments, the quantitative parameter mapping neural network 204 can be implemented as a fully connected (FC) neural network. An example FC neural network (FCNN) architecture is discussed further below with respect to FIG. 6. In some embodiments, the quantitative parameter mapping neural network can be implemented as an encoder-decoder neural network with skip connections (e.g., U-Net). The quantitative parameter mapping neural network 204 can be trained using known methods. In some embodiments, the quantitative parameter mapping neural network 204 can be trained using training data 222. In some embodiments, the quantitative parameter mapping neural network 204 can be trained using training data 222 that includes a combination of both existing native weighted MR data and existing post-contrast weighted MR data. In some embodiments, the quantitative mapping neural network 204 can be trained using training data 222 that includes only existing native weighted MR data. In some embodiments, the quantitative parameter mapping neural network 204 can be trained using training data 222 that includes only existing post-contrast weighted MR data. In some embodiments, the quantitative parameter mapping neural network 204 can be trained using training data 222 that includes a combination of numerically simulated MR data and MR phantom data. In some embodiments, the training data 222 (e.g., existing acquired MR data or a combination of numerically simulated MR data and MR phantom data) can encompass multiple different confounders (e.g., angle, heart rate, $B_0$, $B_1$, off-resonance, etc.). In some example embodiments, the quantitative parameter mapping neural network 204 is an FC neural network trained for $T_1$ mapping and can be trained using existing data from Modified Look-Locker Inversion Recovery (MOLLI) sequences.

As mentioned above, the quantitative parameter mapping neural network 204 may be configured to generate an output 206 including at least one or more quantitative parameter maps. The quantitative parameter map(s) 206 generated by the quantitative parameter mapping neural network 204 can be displayed on a display 216, for example, a display of an MRI system (e.g., displays 104, 136 and/or 144 of MRI system 100 shown in FIG. 1) or other computer system. In addition, the quantitative map(s) 206 may also be stored in data storage 218 (e.g., data storage of the MRI system 100 shown in FIG. 1 or other computer system). In some embodiments, the generated quantitative map(s) 206 can be provided to a post-processing module 220 for analysis and any necessary further processing such as, for example distortion correction. In some embodiments, the post-processing module 220, can include machine learning (e.g., a neural network) configured to provide automated analysis of the generated quantitative map(s) 206. The output of the post-processing module 220 may be displayed on a display 216, for example, a display of an MRI system (e.g., displays 104, 136 and/or 144 of MRI system 100 shown in FIG. 1) or other computer system. In addition, the output of the post-processing module 220 may also be stored in data storage 218 (e.g., data storage of the MRI system 100 shown in FIG. 1 or other computer system).

In some embodiments, the quantitative parameter mapping neural network 204, the post-processing module 220, the image reconstruction 210, and motion correction 212 may be implemented on one or more processors (or processor devices) of a computer system such as, for example, any general-purpose computing system or device, such as a personal computer, workstation, cellular phone, smartphone, laptop, tablet, or the like. As such, the computer system may include any suitable hardware and components designed or capable of carrying out a variety of processing and control tasks including, but not limited to, steps for implementing the quantitative parameter mapping neural network 204, receiving an plurality of weighted images and at least one imaging parameter 202, implementing the post-processing module 220, implementing image reconstruction 210, implementing motion correction 212, providing the quantitative parameter map(s) 206 to a display 216, storing the quantitative parameter map(s) 206 in data storage 216, providing the quantitative parameter map(s) 206 to the post-processing module 220, providing an output of the post-processing module 220 to a display 216, storing the output of the post-processing module 220 in data storage 216. For example, the computer system may include a programmable processor or combination of programmable processors, such as central processing units (CPUs), graphics processing units (GPUs), and the like. In some implementations, the one or more processor of the computer system may be configured to execute instructions stored in a non-transitory computer readable-media. In this regard, the computer system may be any device or system designed to integrate a variety of software, hardware, capabilities and functionalities. Alternatively, and by way of particular configurations and programming, the computer system may be a special-purpose system or device. For instance, such special-purpose system or device may include one or more dedicated processing units or modules that may be configured (e.g., hardwired, or pre-programmed) to carry out steps, in accordance with aspects of the present disclosure.

In some embodiments, the disclosed system and method for quantitative parameter mapping may be deployed on an MRI system or scanner (e.g., MRI system 100 shown in FIG. 1) for prospective data collection and inline quantitative parameter mapping. For example, in some embodiments, system 200 (including the quantitative parameter mapping neural network 204) may be integrated into the clinical workflow on an MRI system for acquisition of MR images and generation of quantitative parameter maps. The inline implementation of the system 200 can allow for rapid deployment of the disclosed system and method in clinical workflow and prospective accelerated image acquisition and quantitative parameter mapping.

Figure 3:
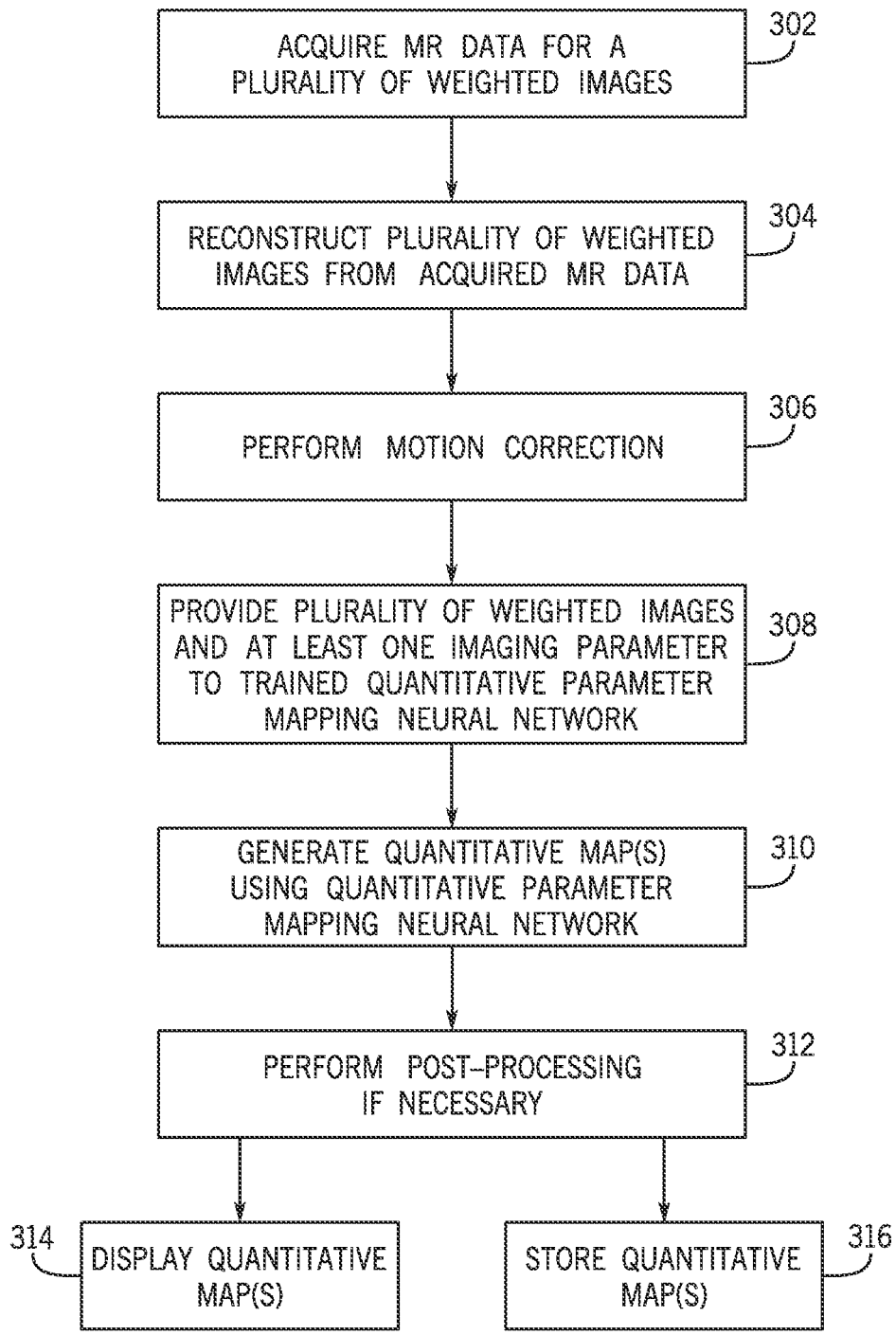
FIG. 3 illustrates a method for quantitative parameter mapping using magnetic resonance images in accordance with an embodiment.

FIG. 3 illustrates a method for quantitative parameter mapping using magnetic resonance images in accordance with an embodiment. The process illustrated in FIG. 3 is described below as being carried out by the system 200 for generating a magnetic resonance image as illustrated in FIG. 2. Although the blocks of the process are illustrated in a particular order, in some embodiments, one or more blocks may be executed in a different order than illustrated in FIG. 3 or may be bypassed.

Figure 4:
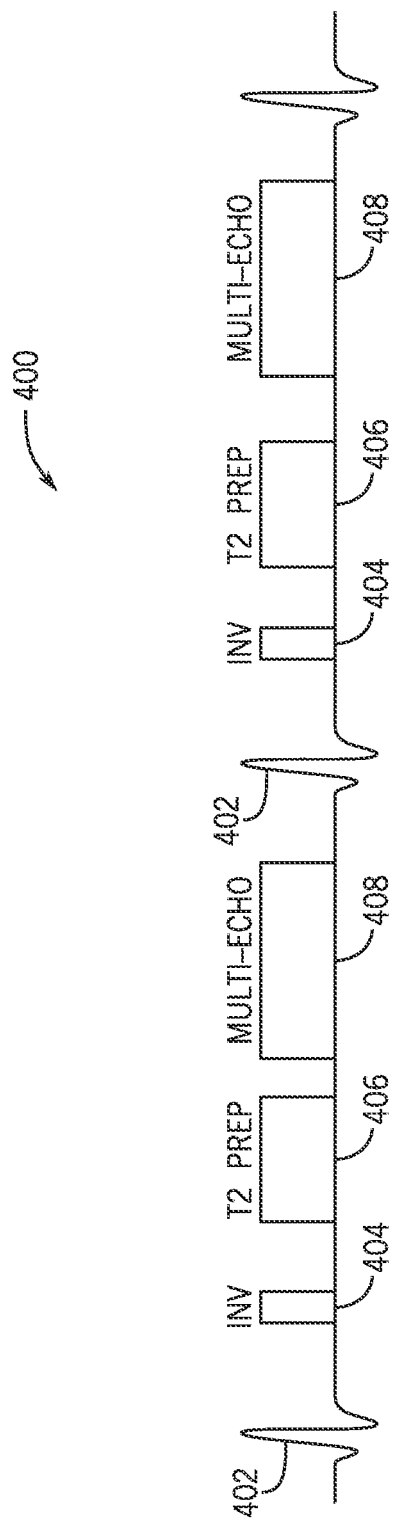
FIG. 4 is a pulse sequence diagram of an example sequence for acquisition of multi-contrast MR data in accordance with an embodiment.
Figure 5:
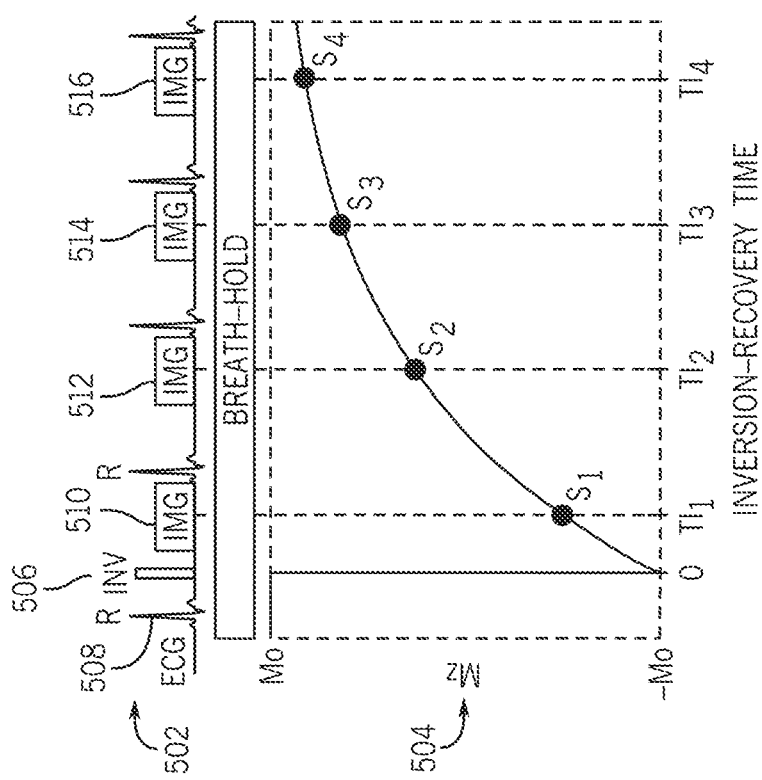
FIG. 5 is a pulse sequence diagram of an example sequence for acquisition of $T_1$-weighted MR data in accordance with an embodiment.

The method shown in FIG. 3 illustrates an embodiment where the plurality of weighted images may be acquired in real-time using an MRI system. However, as discussed above, it should be understood that in some embodiments the plurality of weighted images may be retrieved from data storage. Referring to FIG. 3, at block 302, MR data 208 (e.g., weighted or multi-contrast MR data) may be acquired from a subject for a plurality of weighted images using a pulse sequence, for example, a multi-contrast sequence as shown in FIG. 4, a $T_1$ mapping sequence as shown in FIG. 5, a $T_2$ mapping sequence, etc., implemented on an MRI system such as, for example, MRI system 100 shown in FIG. 1. The acquired MR data 208 may be stored in, for example, data storage 214 of system 200, data storage of an MR system (e.g., MRI system 100 shown in FIG. 1), or data storage of other computer systems. At block 304, the plurality of weighted images may be reconstructed (e.g., using image reconstruction module 210) from the acquired MR data 208 using known reconstruction methods and, at block 306, motion correction on the plurality of weighted images may be performed using known methods (e.g., using motion correction module 212).

In some embodiments, the plurality of weighted images ae weighted based on one or more tissue properties or parameters and can be, for example, $T_1$-weighted images, $T_2$-weighted images, $T_2^*$-weighted images, $T_{1p}$-weighted images, or multi-contrast images with weighting for two or more tissue parameters. In some embodiments, where the images are $T_1$-weighted images, four $T_1$-weighted images and four corresponding inversion times (TI) for the four $T_1$-weighted images can be input to the quantitative parameter mapping neural network 204. In some embodiments, the plurality of weighted images are cardiac MR images. As mentioned, in some embodiments, the plurality of weighted images may be multi-contrast images. An example multi-contrast pulse sequence which may be used to acquire the retrieved or real-time plurality of weighted images is describes further below with respect to FIG. 4. In some embodiments, the plurality of weighted images may be $T_1$-weighted images. An example $T_1$-weighted pulse sequence which may be used to acquire the plurality of weighted images is discussed further below with respect to FIG. 5. In some embodiments, the plurality of weighted images may be $T_2$-weighted images and a pulse sequence for acquiring $T_2$-weighted MR data may be used to acquire plurality of weighted images. In some embodiments, the $T_2$ pulse sequence can include, for example, a series of $T_2$-preparation modules and data acquisition modules with varying times of $T_2$ preparation.

At block 308, the plurality of weighted images and at least one corresponding imaging parameter may be provided to a trained quantitative parameter mapping neural network 204 such as, for example, an FC neural network or an encoder-decoder neural network with skip connection (e.g., U-Net). The at least one imaging parameter can include, for example, inversion recovery time (TI), flip angle, echo time (TE), repetition time (TR), etc. At block 310, the quantitative parameter mapping neural network 204 can be used to estimate quantitative tissue parameter values (e.g., $T_1$, $T_2$, $T_2^*$, $T_1p$, etc.) and generate one or more quantitative maps 206 for the subject (e.g., $T_1$ map(s), $T_2$ maps, and/or $T_2^*$ maps, etc). For example, for $T_1$-mapping, the quantitative parameter mapping neural network 204 can be configured to estimate pixel-wise $T_1$ values using an input of a plurality of $T_1$-weighted images of a subject and corresponding inversion times as the imaging parameter. In some embodiments, the quantitative parameter mapping neural network 204 may be implemented using known machine learning or artificial intelligence models or architectures. In some embodiments, the quantitative parameter mapping neural network 204 can be implemented as a fully connected (FC) neural network. An example FC neural network (FCNN) architecture is discussed further below with respect to FIG. 6. In some embodiments, the quantitative parameter mapping neural network can be implemented as an encoder-decoder neural network with skip connections (e.g., U-Net).

At block 312, post-processing such as, for example, analysis or other further processing (e.g., distortion correction) may be performed (e.g., using post-processing module 220) on the quantitative map(s) 206, if necessary. At block 314, the generated quantitative map(s) 206 may be displayed on, for example, a display 216 of system 200, a display of an MRI system (e.g., displays 104, 136 and/or 144 of MRI system 100 shown in FIG. 1) or other computer system. At block 316, the generated quantitative map(s) 206 may also be stored in data storage 218 (e.g., data storage of the MRI system 100 shown in FIG. 1 or other computer system). In some embodiments, the output of the post-processing module 220 may be displayed on a display 216, for example, a display of an MRI system (e.g., displays 104, 136 and/or 144 of MRI system 100 shown in FIG. 1) or other computer system. In addition, the output of the post-processing module 220 may also be stored in data storage 218 (e.g., data storage of the MRI system 100 shown in FIG. 1 or other computer system).

As mentioned above, the plurality of weighted images input to the quantitative mapping neural network 204 may be retrieved from data storage 214 or may be acquired in real-time. In some embodiments, the plurality of weighted images are multi-contrast images and a multi-contrast pulse sequence can be used to acquire multi-contrast MR data (e.g., as MR data 208). FIG. 4 is a pulse sequence diagram of an example sequence for acquisition of multi-contrast MR data in accordance with an embodiment. In FIG. 4, a multi-contrast pulse sequence 400 includes an inversion pulse (INV) 404 after an ECG trigger 402. The inversion pulse 404 is followed by a $T_2$-preparation module 406 and a multi-echo acquisition 408. In some embodiments, by varying, for example, the $T_2$-prep time and echo times, data can be acquired that can be used to create images which are weighted by different contrasts. In another example, in some embodiments, a single Look-Locker sequence (or experiment) can be used to acquire $T_1$-weighted MR data 208. As mentioned, in some embodiments, the plurality of weighted images may be $T_1$-weighted images. FIG. 5 is a pulse sequence diagram of an example sequence for acquisition of $T_1$-weighted MR data in accordance with an embodiment. In FIG. 5, a Look-Locker 4 (or LL4) pulse sequence 502 and a magnetization recovery curve 504 are shown. In the example LL4 pulse sequence 502, after an inversion pulse (INV) 506, four ECG-triggered (i.e., by heartbeats (R) 508) images 510 ($S_1$), 512 ($S_2$), 514 ($S_3$), and 516 ($S_4$) are acquired using a single-shot balanced steady-state free-precession (bSSFP) readout on successive cardiac cycles with a single-breath-hold. The inversion recovery time (TI), which is defined as the period between the inversion pulse 506 and the acquisition of the central k-space line, is $TI_1$ for the first image ($S_1$) and $TI_1+(n-1)*RR$, where RR is the heartbeat interval (or duration of one heartbeat), for the image acquired in the $n^{th}$ cardiac cycle. In some embodiments, the plurality of weighted images are $T_2$-weighted images and a pulse sequence for acquiring $T_2$-weighted MR data may be used to acquire the MR data 208. In some embodiments, the $T_2$ pulse sequence can include, for example, a series of $T_2$-preparation modules and data acquisition modules with varying times of $T_2$ preparation.

Figure 6:
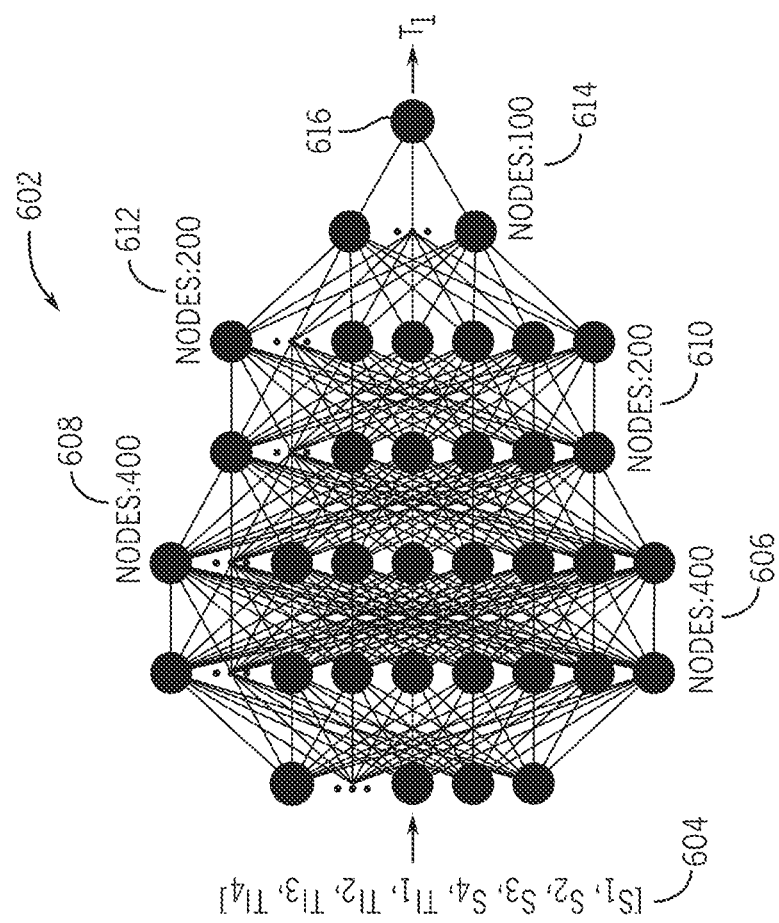
FIG. 6 illustrates an example fully connected (FC) neural network for generating quantitative $T_1$ maps in accordance with an embodiment.

As mentioned, in some embodiments, the quantitative parameter mapping neural network 204 can be a fully connected neural network trained for $T_1$ mapping. FIG. 6 illustrates an example fully connected (FC) neural network for generating $T_1$ maps in accordance with an embodiment. In FIG. 6, the $T_1$ mapping FC neural network 602 is configured for estimating pixel-wise $T_1$ values (e.g., output 616) for the $T_1$ maps. The input 604 to the model can include pixel-values from $T_1$-weighted images (i.e. $S_i$) and corresponding inversion times (i.e., $TI_i$). In some embodiments, the input advantageously includes four $T_1$-weighted images and corresponding inversion times. In some embodiments, the $T_1$ mapping FC neural network 602 can have various parameters and optimizations. The example $T_1$ mapping FC neural network 602 shown in FIG. 6 includes six layers 606-616. The first two layers 606, 608 can include 400 neurons, the third and fourth layers 610, 612 can include 200 neurons, the fifth layer 614 can include 100 neurons, and the sixth layer or output 616 can include one neuron. In the example $T_1$ mapping FC neural network 602, a Leaky Rely activation function may be used with a mini batch of 64 and Adam optimizer with learning rate of 0.01 and a weight decay of 0.0001.

In some embodiments, the quantitative parameter mapping neural network 204 can be an encoder-decoder neural network with skip connections (e.g., U-Net) trained for $T_1$ mapping. In this example, the encoder-decoder neural network with skip connection can include an encoder used to obtain disentangled feature representation. For example, the encoder can consist of eight convolutional layers with convolutional filters of 3×3 and a max-pooling of 2×2 after every two convolutional layers. In this example network, the number of feature maps increases from 64 for the two first layers to 512 for the last two layers. The network can use an ReLU activation function. Each decoder level can begin with an up-sampling layer followed by a convolution to reduce the number of features by a factor of 2. Then, the up-sampled features can be combined with features from the corresponding level of the encoder part using concatenation.

Figure 7:
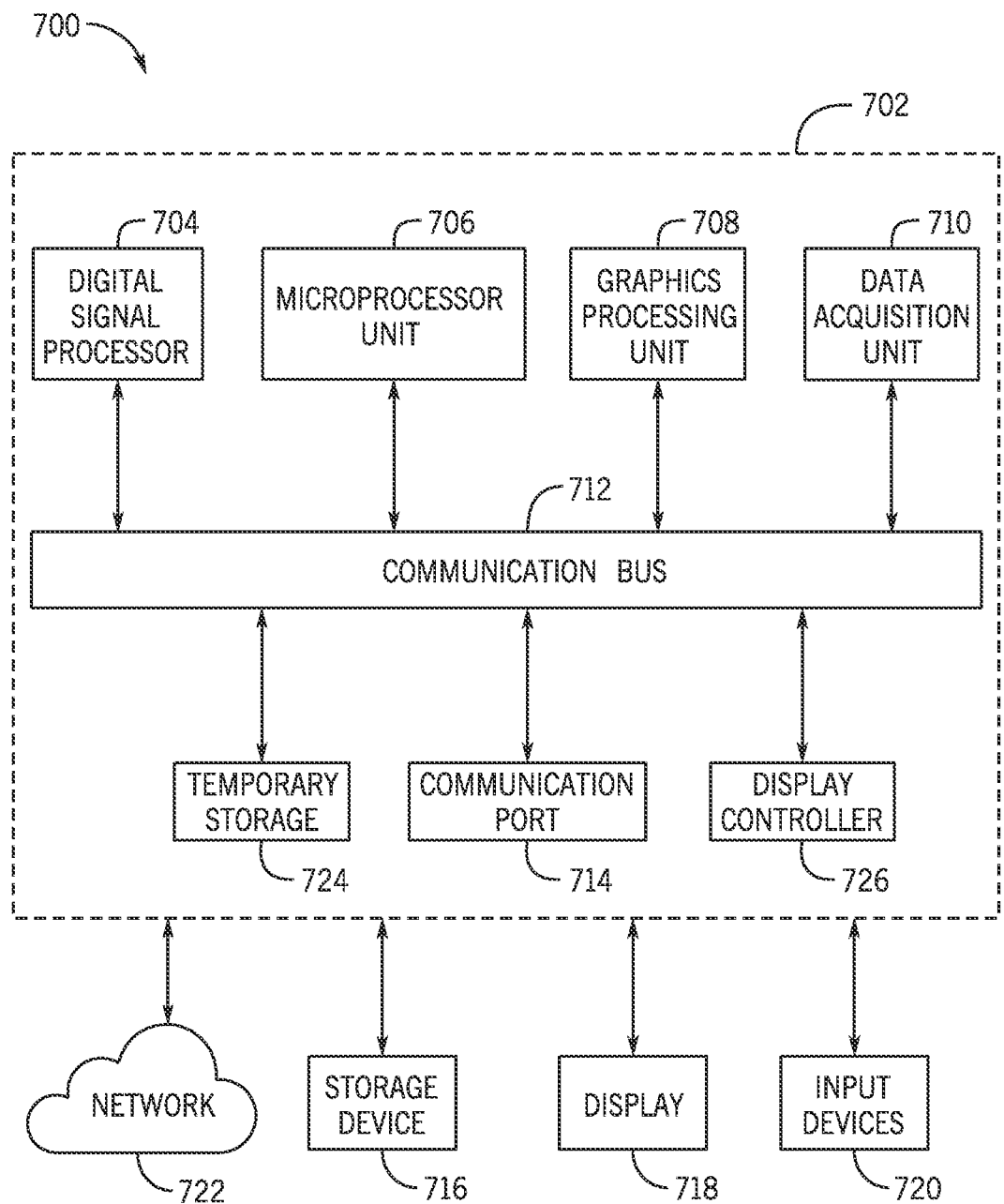
FIG. 7 is a block diagram of an example computer system in accordance with an embodiment.

FIG. 7 is a block diagram of an example computer system in accordance with an embodiment. Computer system 700 may be used to implement the systems and methods described herein. In some embodiments, the computer system 700 may be a workstation, a notebook computer, a tablet device, a mobile device, a multimedia device, a network server, a mainframe, one or more controllers, one or more microcontrollers, or any other general-purpose or application-specific computing device. The computer system 700 may operate autonomously or semi-autonomously, or may read executable software instructions from the memory or storage device 716 or a computer-readable medium (e.g., a hard drive, a CD-ROM, flash memory), or may receive instructions via the input device 720 from a user, or any other source logically connected to a computer or device, such as another networked computer or server. Thus, in some embodiments, the computer system 700 can also include any suitable device for reading computer-readable storage media.

Data, such as data acquired with an imaging system (e.g., a magnetic resonance imaging (MRI) system) may be provided to the computer system 700 from a data storage device 716, and these data are received in a processing unit 702. In some embodiment, the processing unit 702 includes one or more processors. For example, the processing unit 702 may include one or more of a digital signal processor (DSP) 704, a microprocessor unit (MPU) 706, and a graphics processing unit (GPU) 708. The processing unit 702 also includes a data acquisition unit 710 that is configured to electronically receive data to be processed. The DSP 704, MPU 706, GPU 708, and data acquisition unit 710 are all coupled to a communication bus 712. The communication bus 712 may be, for example, a group of wires, or a hardware used for switching data between the peripherals or between any components in the processing unit 702.

The processing unit 702 may also include a communication port 714 in electronic communication with other devices, which may include a storage device 716, a display 718, and one or more input devices 720. Examples of an input device 720 include, but are not limited to, a keyboard, a mouse, and a touch screen through which a user can provide an input. The storage device 716 may be configured to store data, which may include data such as, for example, acquired MR data, weighted MR images, estimated quantitative parameters, quantitative parameter maps, whether these data are provided to, or processed by, the processing unit 702. The display 718 may be used to display images and other information, such as magnetic resonance images, patient health data, and so on.

The processing unit 702 can also be in electronic communication with a network 722 to transmit and receive data and other information. The communication port 714 can also be coupled to the processing unit 702 through a switched central resource, for example the communication bus 712. The processing unit can also include temporary storage 724 and a display controller 726. The temporary storage 724 is configured to store temporary information. For example, the temporary storage 724 can be a random access memory.

Computer-executable instructions for quantitative parameter mapping using magnetic resonance (MR) images according to the above-described methods may be stored on a form of computer readable media. Computer readable media includes volatile and nonvolatile, removable, and non-removable media implemented in any method or technology for storage of information such as computer readable instructions, data structures, program modules or other data. Computer readable media includes, but is not limited to, random access memory (RAM), read-only memory (ROM), electrically erasable programmable ROM (EEPROM), flash memory or other memory technology, compact disk ROM (CD-ROM), digital volatile disks (DVD) or other optical storage, magnetic cassettes, magnetic tape, magnetic disk storage or other magnetic storage devices, or any other medium which can be used to store the desired instructions and which may be accessed by a system (e.g., a computer), including by internet or other computer network form of access.

The present invention has been described in terms of one or more preferred embodiments, and it should be appreciated that many equivalents, alternatives, variations, and modifications, aside from those expressly stated, are possible and within the scope of the invention.

The invention claimed is:

1. A system for quantitative parameter mapping using magnetic resonance (MR) images, the system comprising:
   an input for receiving a plurality of weighted MR images of a subject and a corresponding at least one imaging parameter for the plurality of weighted MR images;
   a quantitative parameter mapping neural network coupled to the input and configured to estimate at least one tissue parameter and generate at least one quantitative map for the at least one tissue parameter based on the plurality of weighted MR images of the subject and the corresponding at least one imaging parameter for the plurality of weighted MR images, wherein the quantitative parameter mapping neural network is trained using a set of training data utilizing at least one confounder for the quantification of the at least one tissue parameter; and
   a display coupled to the quantitative parameter mapping neural network and configured to display the at least one quantitative map.

2. The system according to claim 1, wherein the plurality of weighed MR images are one of multi-contrast weighted images, $T_1$-weighted images, $T_2$-weighted images, $T_2^*$-weighted images and $T_1p$-weighted images.

3. The system according to claim 1, wherein the at least one tissue parameter is one of $T_1$, $T_2$, $T_2^*$, or $T_1p$.

4. The system according to claim 1, wherein the quantitative parameter mapping neural network is a fully compensated (FC) neural network.

5. The system according to claim 1, wherein the quantitative parameter mapping neural network is an encoder-decoder neural network with skip connections.

6. The system according to claim 1, wherein the quantitative parameter mapping neural network is trained using a set of training data comprising a combination of native and post-contrast MR data.

7. The system according to claim 1, wherein the quantitative parameter mapping neural network is trained using a set of training data comprising a combination of numerically simulated MR data and MR phantom data.

8. The system according to claim 1, wherein the at least one confounder is one of angle, heart rate, $B_0$, $B_1$, or off-resonance.

9. A method for quantitative parameter mapping using magnetic resonance (MR) images, the method comprising:
   acquiring, using a magnetic resonance imaging (MRI) system, MR data from a subject for a plurality of weighted images using a pulse sequence;
   generating a plurality of weighted MR images of a subject from the acquired MR data, each of the plurality of weighted MR images having a corresponding at least one imaging parameter;
   providing, using a processor, the plurality of weighted MR images of the subject and the corresponding at least one imaging parameter for the plurality of weighted MR images to a quantitative parameter mapping neural network, wherein the quantitative parameter mapping neural network is trained using a set of training data utilizing at least one confounder for the quantification of the at least one tissue parameter;
   generating, using the quantitative parameter mapping neural network, an estimate of at least one tissue parameter and at least one quantitative map for the at least one tissue parameter based on the plurality of weighted MR images of the subject and the corresponding at least one imaging parameter for the plurality of weighted MR images; and
   displaying, using a display, the at least one quantitative map.

10. The method according to claim 9, wherein the plurality of weighed MR images are one of multi-contrast weighted images, $T_1$-weighted images, $T_2$-weighted images, $T_2^*$-weighted images, and $T_1p$-weighted images.

11. The method according to claim 9, wherein the at least one tissue parameter is one of $T_1$, $T_2$, $T_2^*$, or $T_1p$.

12. The method according to claim 9, wherein the quantitative parameter mapping neural network is a fully connected (FC) neural network.

13. The method according to claim 9, wherein the quantitative parameter mapping neural network is an encoder-decoder neural network with skip connections.

14. The method according to claim 9, wherein the quantitative parameter mapping neural network is trained using a set of training data comprising a combination of native and post-contrast MR data.

15. The method according to claim 7, wherein the quantification parameter mapping neural network is trained using a set of training data comprising a combination of numerically simulated MR data and MR phantom data.

16. The method according to claim 9, wherein the at least one confounder is one of angle, heart rate, $B_0$, $B_1$, or off-resonance.

17. A magnetic resonance imaging (MRI) system comprising:
   a magnet system configured to generate a polarizing magnetic field about at least a portion of a subject;
   a magnetic gradient system including a plurality of magnetic gradient coils configured to apply at least one magnetic gradient field to the polarizing magnetic field;
   a radio frequency (RF) system configured to apply an RF field to the subject and to receive magnetic resonance signals from the subject using a coil array; and
   a computer system programmed to
      acquire MR data from a subject for a plurality of weighted images using a pulse sequence;
      generate a plurality of weighted MR images of a subject from the acquired MR data, each of the plurality of weighted MR images having a corresponding at least one imaging parameter;
      provide the plurality of weighted MR images of the subject and the corresponding at least one imaging parameter for the plurality of weighted MR images to a quantitative parameter mapping neural network, wherein the quantitative parameter mapping neural network is trained using a set of training data utilizing at least one confounder for the quantification of the at least one tissue parameter; and
      generate, using the quantitative parameter mapping neural network, an estimate of at least one tissue parameter and at least one quantitative map for the at least one tissue parameter based on the plurality of weighted MR images of the subject and the corresponding at least one imaging parameter for the plurality of weighted MR images.

18. The MRI system according to claim 17, wherein the quantitative parameter mapping neural network is a fully connected (FC) neural network.

19. The MRI system according to claim 17, wherein the quantitative parameter mapping neural network is trained using a set of training data comprising a combination of native and post-contrast MR data.

20. The MRI system according to claim 17, wherein the quantification parameter mapping neural network is trained using a set of training data comprising a combination of numerically simulated MR data and MR phantom data.

* * * * *